(12) United States Patent
Chang et al.

(10) Patent No.: US 9,026,956 B1
(45) Date of Patent: May 5, 2015

(54) METHOD OF LITHOGRAPHIC PROCESS EVALUATION

(71) Applicant: Taiwan Semiconductor Manufacturing Co., Ltd., Hsin-Chu (TW)

(72) Inventors: Chia-Cheng Chang, Baoshan Township (TW); Wei-Kuan Yu, Hsinchu (TW); Tsai-Ming Huang, Zhubei (TW); Chin-Min Huang, Taichung (TW); Cherng-Shyan Tsay, Toufen Township (TW); Chien Wen Lai, Hsinchu (TW); Hua-Tai Lin, Hsinchu (TW); Shih-Ming Chang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/051,640

(22) Filed: Oct. 11, 2013

(51) Int. Cl.
*G06F 17/50* (2006.01)
(52) U.S. Cl.
CPC .................. *G06F 17/5081* (2013.01)
(58) Field of Classification Search
USPC .......................................................... 716/54
See application file for complete search history.

(56) References Cited

U.S. PATENT DOCUMENTS 7,355,673 B2    4/2008  Hsu et al.
8,209,161 B2 *  6/2012  Zhu ................................. 703/13
2013/0283216 A1 * 10/2013  Pearman et al. ................ 716/52

OTHER PUBLICATIONS

Lim, Jung-Ho, et al. "Advanced Scanner Matching Using Freeform Source and Lens Manipulators." Optical Microlithography XXIV. Published in 2011. 22 Pages.
Chang, Simon, et al. "Exploration of Complex Metal 2D Design Rules Using Inverse Lithography." Design for Manufacturability through Design-Process Integration III. Mar. 12, 2009.
ASML "LithoCruiser Info Sheet." Nov. 30, 2006. 3 Pages.

\* cited by examiner

*Primary Examiner* — Eric Lee
(74) *Attorney, Agent, or Firm* — Eschweiler & Associates, LLC (57) ABSTRACT

Some embodiments of the present disclosure relate to a method to simulate patterning of a layout. The method comprises simulating formation of a layout pattern under a first lithography condition. The first lithography condition comprises a set of parameters, wherein a value of each parameter is defined by a corresponding process model. The method further comprises randomly varying the value of each parameter of the first lithography condition within a range of values defined by the corresponding process model of the parameter, to create a second lithography condition. Formation of a layout pattern is then re-simulated under the second lithography condition. Random variation of the value of each parameter is repeated to create additional lithography conditions. And, each lithography condition is re-simulated until the value of each parameter has been substantially varied across a range of its respective process model.

20 Claims, 5 Drawing Sheets

| $y_m$ | $f(x_1,y_m)$ | $f(x_2,y_m)$ | $f(x_3,y_m)$ | $f(x_4,y_m)$ | $f(x_5,y_m)$ | | $f(x_n,y_m)$ |
|---|---|---|---|---|---|---|---|
| | | | ⋮ | | | ⋱ | |
| $y_5$ | $f(x_1,y_5)$ | $f(x_2,y_5)$ | $f(x_3,y_5)$ | $f(x_4,y_5)$ | $f(x_5,y_5)$ | | $f(x_n,y_5)$ |
| $y_4$ | $f(x_1,y_4)$ | $f(x_2,y_4)$ | $f(x_3,y_4)$ | $f(x_4,y_4)$ | $f(x_5,y_4)$ | | $f(x_n,y_4)$ |
| $y_3$ | $f(x_1,y_3)$ | $f(x_2,y_3)$ | $f(x_3,y_3)$ | $f(x_4,y_3)$ | $f(x_5,y_3)$ | ⋯ | $f(x_n,y_3)$ |
| $y_2$ | $f(x_1,y_2)$ | $f(x_2,y_2)$ | $f(x_3,y_2)$ | $f(x_4,y_2)$ | $f(x_5,y_2)$ | | $f(x_n,y_2)$ |
| $y_1$ | $f(x_1,y_1)$ | $f(x_2,y_1)$ | $f(x_3,y_1)$ | $f(x_4,y_1)$ | $f(x_5,y_1)$ | | $f(x_n,y_1)$ |
| | $x_1$ | $x_2$ | $x_3$ | $x_4$ | $x_5$ | | $x_n$ |

| Method | NA | Sigma out | Sigma in | DOF | MEEF | ILS | X-CDU | Y-CDU |
|---|---|---|---|---|---|---|---|---|
| 602 | 0.859 | 0.8 | 0.573 | 371 | 1.16 | 36.5 | 3.5 | 4.7 |
| 604 | 0.98 | 0.8 | 0.471 | 307 | 1.21 | 40.8 | 5.2 | 7.4 |

Fig. 6

METHOD OF LITHOGRAPHIC PROCESS EVALUATION

BACKGROUND

In semiconductor manufacturing a lithography tool to supplies radiation that is filtered by a mask to pattern an integrated circuit (IC). In optical lithography, the mask contains a target layout pattern of transparent and opaque areas, which correspond to an individual layer of the IC. The radiation is transmitted by the transparent areas and blocked by the opaque areas, which transfers the target layout pattern onto a substrate to form an on-wafer layout pattern. Some differences between the target layout pattern and on-wafer layout pattern are attributed to parameters of the lithography process, including, but not limited to: beam coherence, depth of focus (DOF), numerical aperture (NA), mask error enhancement factor (MEEF), image log slope (ILS), photoresist thickness, etc. In order to determine how these lithography parameters influence formation of the on-wafer layout pattern, a simulation of the patterning as a function of the lithography parameters is performed.

DETAILED DESCRIPTION

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It is evident, however, that one or more aspects described herein may be practiced with a lesser degree of these specific details. In other instances, known structures and devices are shown in block diagram form to facilitate understanding.

Layout patterning in advanced technology nodes (e.g., node 20 and beyond) in accordance with Moore's Law scaling has driven the minimum feature size, or "critical dimension" (CD), of a target layout pattern to the resolvable limit of optical lithography (i.e., visible light). Enhancement techniques such as illumination source optimization (ISO), immersion methods to decrease NA, and an optical proximity correction (OPC) techniques including shape biasing and the placement of assist features (AFs), allow for continued scaling. These methods drive increasingly complex implementations when utilized in combination. To increase design efficiency under these conditions, techniques such as Computational Lithography utilize a lithographic model to simulate an expected on-wafer layout pattern from a target layout pattern. The lithographic model simulates the expected on-wafer layout pattern as a function of parameters including illumination conditions, OPC shape placement, mask error, etc. A large number of simulations under various lithography conditions may be used to determine an optimal lithography condition.

Accordingly, some embodiments of the present disclosure relate to a method to simulate patterning of a layout. The method comprises simulating formation of a layout pattern under a first lithography condition. The first lithography condition comprises a set of parameters, wherein a value of each parameter is defined by a corresponding process model. The method further comprises randomly varying the value of each parameter of the first lithography condition within a range of values defined by the corresponding process model of the parameter, to create a second lithography condition. Formation of a layout pattern is then re-simulated under the second lithography condition. Random variation of the value of each parameter is repeated to create additional lithography conditions. And, each lithography condition is re-simulated until the value of each parameter has been substantially varied across a range of its respective process model. Note that while the optical lithography tools depicted herein are a transmissive type, the methods disclosed may also apply to reflective type such as an extreme ultra-violet (EUV) lithography tool.

Figure 1:
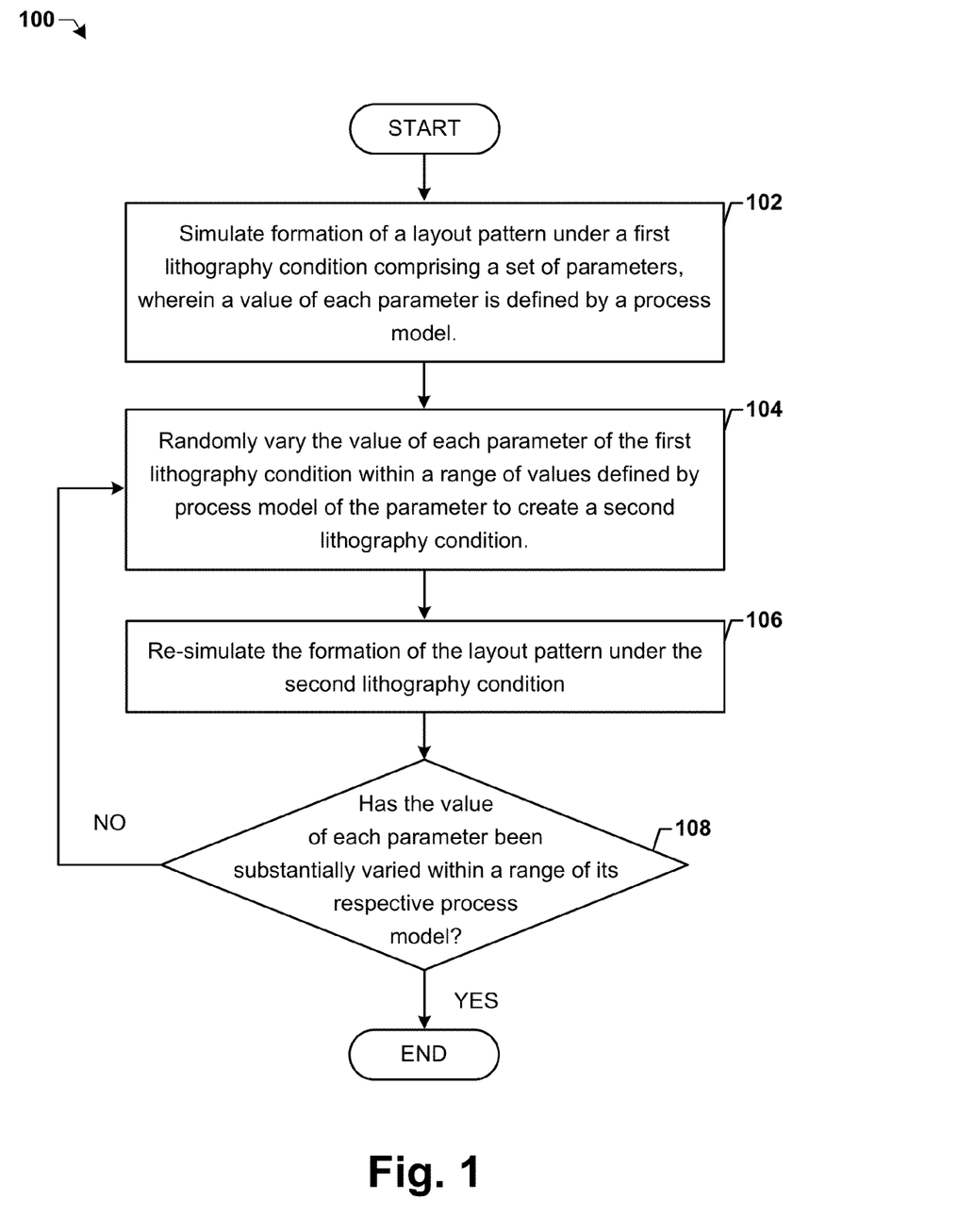
FIG. 1 illustrates some embodiments of method to simulate layout patterning within a lithography tool.

FIG. 1 illustrates some embodiments of method 100 to simulate layout patterning within a lithography tool. While method 100, and subsequently the method 200, are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 102 formation of a layout pattern is simulated. For example, the layout pattern may comprise an OASIS or GDSII data format, comprising features formed on a polysilicon design level, metallization design level, etc. The layout pattern is simulated with an industry-standard lithographic simulation tool such as LITHOCRUISER, or other simulation software configured to model the patterning of the layout pattern under a first lithography condition. The first lithography condition comprises an illumination source type such as a QUASAR illumination source within of an optical lithography tool such as a TWINSCAN XT:1900i 193-nm immersion lithography system. In various embodiments, other optical lithography tools may be used in conjunction DIPOLE, QUADRAPOLE, or QUASAR illumination source, or other illumination source type.

The first lithography condition further comprises a set of parameters for the illumination tool, mask, OPC, etc. The set of parameters define values for various "knobs" of the first lithography condition which may be tuned to find an optimal lithography condition. These "knobs" include depth of focus (DOF) of the radiation, numerical aperture (NA) of the illumination tool, intensity gradient of the radiation as defined by an image log slope (ILS), etc. Additional "knobs" include sigma-outer and sigma-inner settings of the illumination tool, which determine the respective radii of the outer and inner edge of the radiation field. The set of parameters also defines variation in dimensions of a mask used to form the layout pattern such as a mask error enhancement factor (MEEF), which measures the amplification of edge placement errors (EPE) on the mask. The set of parameters also define an OPC treatment of the layout pattern, including target shape biasing (e.g., sizing up or down along one of more edges of a feature), and assist feature (AF) placement such as sub-resolution assist features (SRAFs) (i.e., AFs that do not form on wafer), "negative" SRAFs (i.e., inside the main feature OPC shapes), etc. The mask film stack or wafer film stack (e.g., photoresist type and thickness) may also be modeled.

After simulating the formation of the layout pattern under the first lithography condition, the value of each parameter of the first lithography condition is randomly varied at 104 to create a second lithography condition. Each of the parameters is defined by a process model. A process model gives a range of expected values for its respective parameter that can occur during patterning. For instance, a process model for DOF defines a range in variation of the DOF of the radiation relative to its nominal value as defined by the illumination tool. Similarly, a process model of the film stack includes a range of variation in the photoresist thickness across a wafer relative to its nominal value. In some embodiments, the process model comprises a Gaussian distribution of its respective parameter. In order to randomly vary the value of the parameter, a Monte-Carlo (MC) technique may be used to randomly sample a value for the parameter from within its distribution. In this manner, the value of each parameter of the first lithography condition is varied within a range of values defined by its process model to create the second lithography condition.

The second lithography condition includes a new and randomly-generated combination of parameters relative to the first lithography condition. At 106 formation of the layout pattern under the second lithography condition is re-simulated in the lithographic simulation tool.

At 108 a determination is made as the whether the value of each parameter been substantially varied within a range of its respective process model in prior simulations. Substantial variation comprises sampling of values which are close to the maximum and minimum values (e.g., within 5%, 2%, etc.) of the parameter defined by the model. Substantial variation further comprises sampling of values which are between the maximum and minimum values to a certain resolution. For instance, consider a process model for photoresist film thickness comprising a Gaussian distribution with a mean value of 10 μm and a standard deviation of 1.5 μm. In some embodiments, substantial variation within this process model comprises obtaining values which are within 2% of the maximum value (e.g., 13.5 μm) and minimum value (e.g., 6.5 μm), as defined by the process model. In these embodiments, substantial variation further comprises a resolution of 1 μm, such that values sampled between the maximum and minimum are no more than 1 μm apart. Therefore, a minimum number of samples required for these embodiments to obtain substantial variation within the process model for photoresist film thickness is 8 (e.g., 6.5 μm, 7.5 μm, 8.5 μm, 9.5 μm, 10.5 μm, 11.5 μm, 12.5 μm, and 13.5 μm).

If a determination is made at 108 that each parameter been substantially varied within a range of its respective process model, the method 100 ends and a plurality of simulations obtained from the in previous iterations are examined. However, a determination is made that one or more parameters have not been substantially varied within their respective process model range, then the method 100 returns to 104, and the value of each parameter of the second lithography condition is randomly varied to create a third lithography condition, which is then re-simulated at 106. This process will continue iteratively between 104 and 108 until each parameter has been substantially varied within a range of its respective process model.

The goal of the variation and re-simulation in 100 is to examine a full range of possible patterning conditions defined by the various random combinations of parameters. After the full range has been simulated, the lithographic simulation tool can be used to examine the layout pattern obtained from each simulation in order to determine which one is most suitable for manufacturing. To achieve this, the lithographic simulation tool is configured to measure dimensions of the simulated layout pattern to determine if they are within predetermined limits. In some embodiments, the determined dimensions of the layout pattern comprise a minimum dimension of a feature within the layout pattern, a maximum dimension of the feature, a uniformity of an edge of the feature, or uniformity in a space between two features. An example of determined dimensions will be shown in greater detail in FIGS. 3A-3C.

Figure 2:
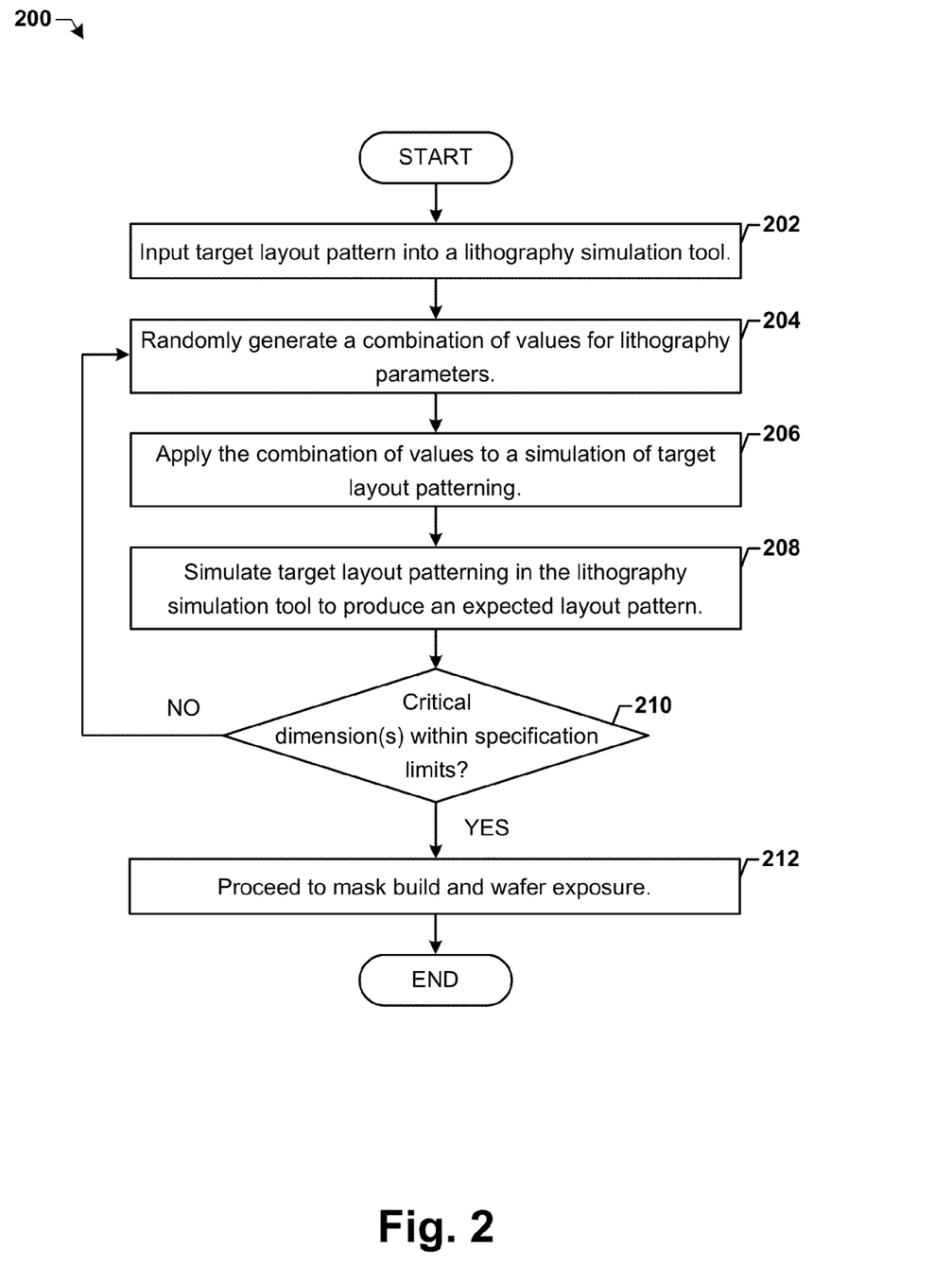
FIG. 2 illustrates some embodiments of method to simulate layout patterning within a lithography tool.

FIG. 2 illustrates an alternative formulation of a method 200 of simulating layout patterning within the lithography tool.

At 202 a target layout pattern (e.g., OASIS, GDSII, etc.) is input into the lithography simulation tool.

At 204 a combination of values for lithography parameters are randomly generated from their respective process models by a Monte-Carlo technique.

At 206 the combination of values lithography parameters is applied to a simulation of target layout patterning within the lithography simulation tool.

At 208 patterning of the target layout is simulated in the lithography simulation tool to produce an expected layout pattern.

At 210 the dimensions of the expected layout pattern are checked to see if they are within specification limits of a lithography process. In some embodiments, specification limits comprise a comprise a minimum dimension of a feature within the layout pattern, a maximum dimension of the feature, a uniformity of an edge of the feature, or a uniformity in a space between two features.

At 212 if the dimensions are within the specification limits, the method 200 proceeds to a mask build of the target wafer pattern and subsequent wafer exposure. If, however, the dimensions are determined to not be within the specification limits at 210, the method returns to 204 and repeats the random generation of the combination of lithography parameters. The method then returns to 206 and re-simulates the target layout patterning, etc. These steps are repeated iteratively within method 200 until the simulated dimensions of the expected layout pattern are within specification limits.

Figures 3A, 3B:
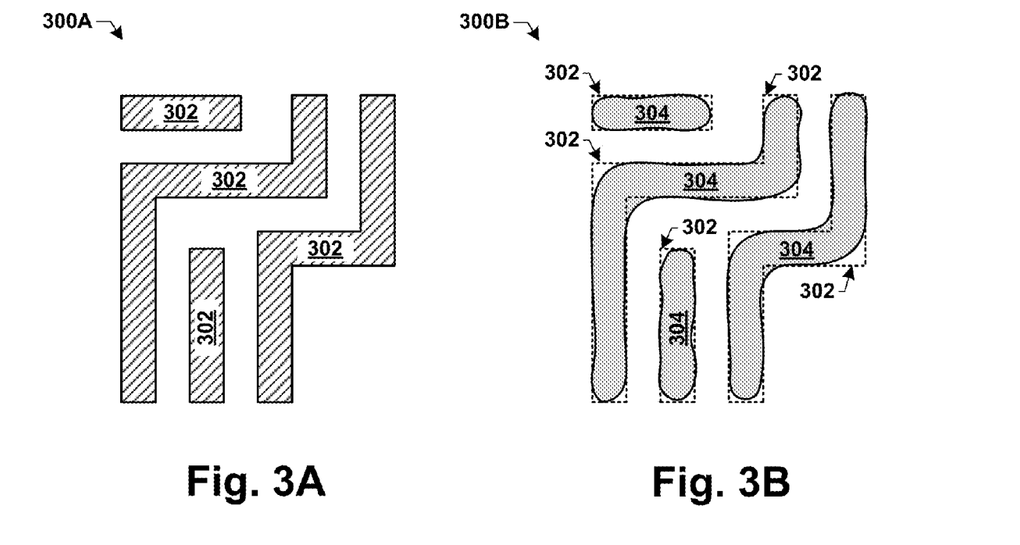
FIGS. 3A-3C illustrate some embodiments of an expected layout pattern formed from a target layout pattern.

FIG. 3A illustrates some embodiments of a target layout pattern 300A comprising target layout features 302, which are formed on a physical design level (e.g., poly-silicon, metallization, etc.) within a layout design window. FIG. 3B illustrates some embodiments of an expected layout pattern 300B, which results from a lithographic simulation of the target layout pattern 300A under a set of lithographic conditions. Variation between expected layout features 304 of the expected layout pattern 300B and the target layout features 302 are attributed to parameters of the lithography process (e.g., NA, inner/outer sigma, DOF, ILS, OPC and AF placement, MEEF, etc.), as well as fundamental limitations of the lithography process such as corner-rounding of the expected layout features 304, etc.

Figure 3C:
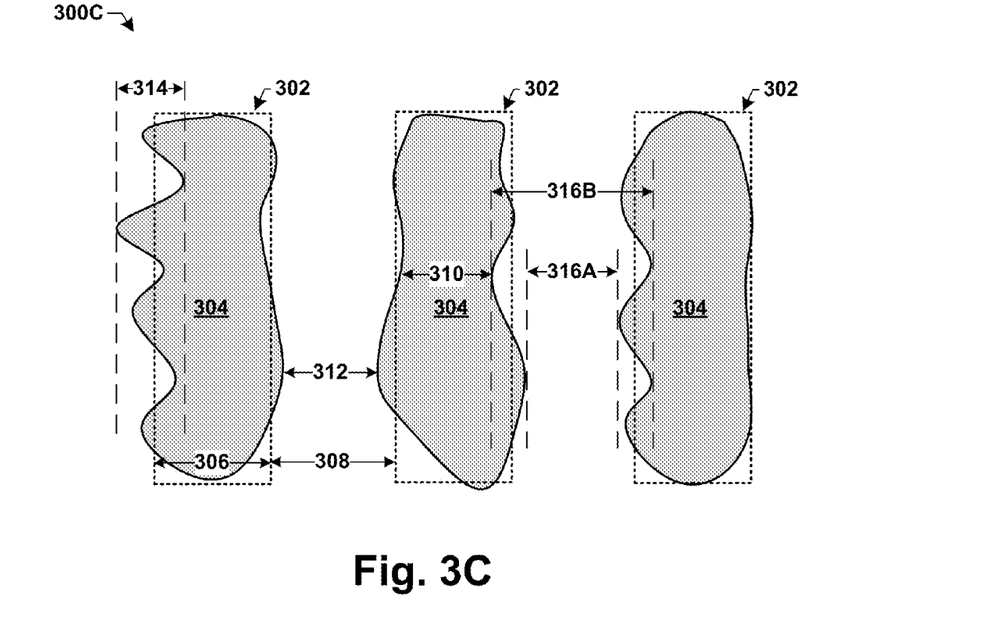

FIG. 3C illustrates an exemplary view 300C of expected layout features 304 and their associated target layout features 302. It is appreciated that the scale of the variation is of the expected layout features 304 relative to their associated target layout features 302 is exaggerated for the purpose of illustration. The target layout features 302, formed in the design window in a layout data format (e.g., OASIS, GDSII, etc.), and comprise a minimum designed width 306 and minimum designed space 308. The aforementioned simulated variations result in expected layout features 304 comprising a minimum simulated width 310 and space 312. To insure that these expected layout features 304 are manufacturable, the minimum simulated width 310 and space 312 must be within design specification limits of the physical layer of the IC which they represent. For instance, for expected layout features 304 formed on a metallization design level, the minimum simulated width 310 must be greater than a critical dimension (e.g., 80% of the minimum designed width 306) to guarantee manufacturability, and hence yield, of the IC. Similarly, the minimum simulated space 312 must be greater than a predetermined threshold. Otherwise, two separate expected layout features 304 could potentially merge and cause a short. A maximum dimension and space of the expected layout features 304 may be considered analogously, depending on the patterning process. Additionally, a uniformity of an edge 314 of the expected layout features 304 may be considered. Uniformity in a space 316A-316B between two expected layout features 304 may also be considered.

Figure 4:
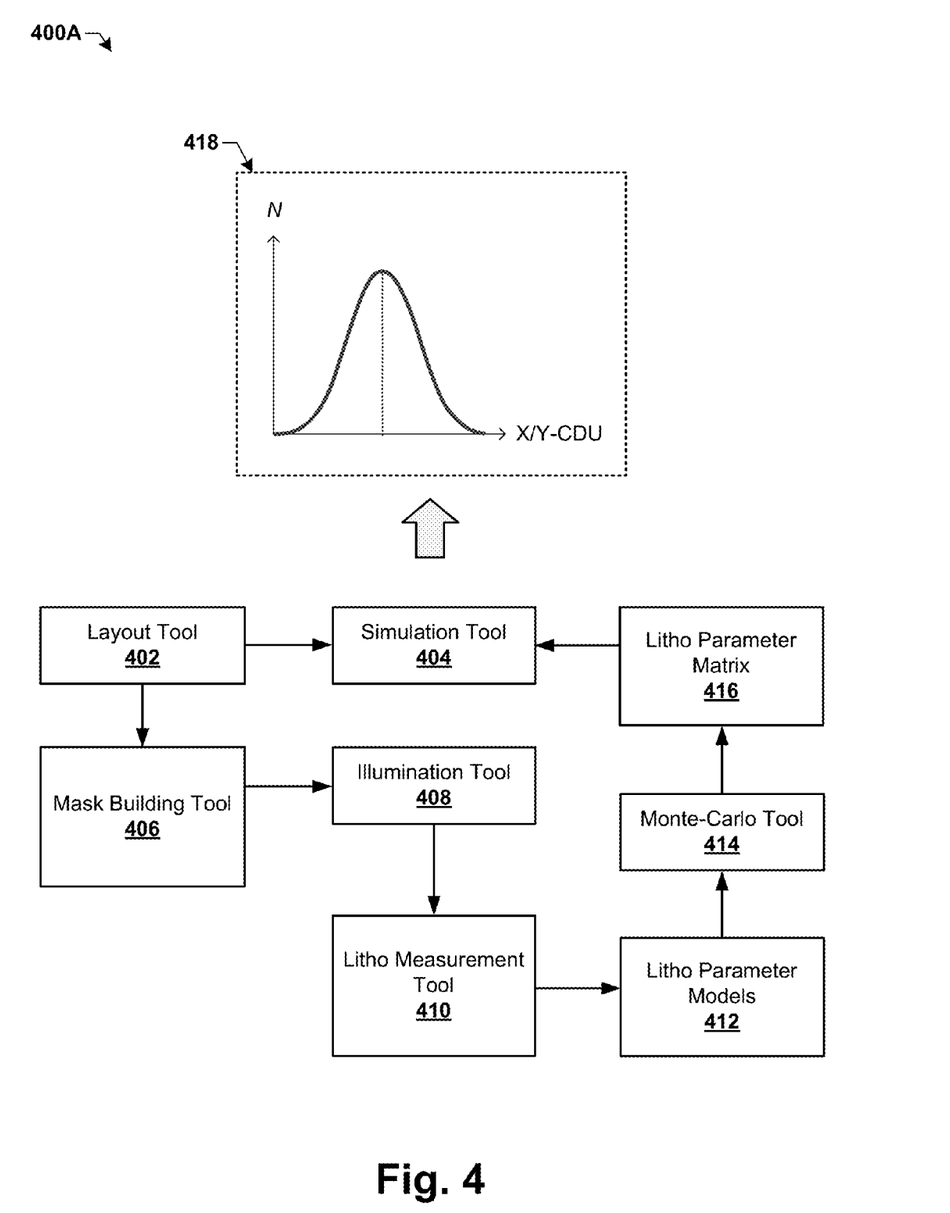
FIG. 4 illustrates some embodiments of a tool arrangement configured to perform a lithography simulation.

FIG. 4 illustrates some embodiments of a tool arrangement 400 configured to perform a lithography simulation. The tool arrangement 400 comprises a layout tool 402 such as a CADENCE VIRTUOSO or MENTOR GRAPHICS design window, configured to produce a layout representation of an IC (e.g., OASIS, GDSII, etc.). The tool arrangement 400 further comprises a simulation tool 404 such a LITHOCRUISER, or other simulation software, configured to model the patterning of the layout representation under a lithography condition determined from lithographic parameter models 412. The tool arrangement 400 further comprises a mask building tool 406 configured to pattern a reticle with a target layout pattern corresponding to the layout representation. In some embodiments, the reticle comprises a quartz photomask which is patterned with a mask film stack comprising a metallic material (e.g., chromium) for optical lithography. In some embodiments, the reticle comprises a multi-layer mirror comprising alternating reflective (e.g., Mo, Ru, etc.) and spacer layers (e.g., Si), configured to reflect incident radiation through Bragg interference for EUV lithography.

The tool arrangement 400 further comprises an illumination tool 408 configured to pattern a substrate with the reticle. In some embodiments, the illumination tool 408 comprises an optical lithography tool (e.g., a TWINSCAN XT:1900i 193-nm immersion lithography system). In some embodiments, the illumination tool 408 comprises an EUV illumination tool comprising a synchrotron, or a plasma source such as ionized xenon (Xe) or tin (Sn) produced by a laser or thermal excitation.

The tool arrangement 400 further comprises a lithographic measurement tool 410. In some embodiments, the lithographic measurement tool 410 comprises an optical measurement tool configured to measure radiation emitted by the illumination tool 408 such a NA, DOF, radiation coherence, intensity, etc. In some embodiments, the lithographic measurement tool 410 is configured to measure variation in dimensions of a mask used to form the layout pattern (e.g., EFE, MEEF, etc.). In some embodiments, the lithographic measurement tool 410 comprises a physical measurement tool such as a scanning electron microscope (SEM) configured to measure the dimensions of on-wafer layout features after patterning. In some embodiments, the lithographic measurement tool 410 is configured to determine a process model (i.e., lithographic parameter models 412) of a parameter by measuring variation of the parameter across a reticle field, by comparing the parameter between two of more reticle fields, by comparing the parameter between two of more wafers, or a combination thereof.

In some embodiments, the lithographic parameter model 412 of a parameter (e.g., NA, inner/outer sigma, DOF, ILS, OPC and AF placement, MEEF, etc.) comprises a Gaussian distribution of the parameter, which is stored in memory for reference by a Monte-Carlo tool 414. The Monte-Carlo tool 414 is configured to randomly-sample a value of each lithography parameter from its respective process model, and to model a lithography condition as a combination of randomly-sampled lithography parameter values. The Monte-Carlo tool 414 is further configured to transmit the lithography condition to the simulation tool 404. In some embodiments, the Monte-Carlo tool 414 is further configured to produce a litho parameter matrix 416 comprising a substantial variation of each lithography parameter value within its respective distribution. The litho parameter matrix 416 will be discussed in greater detail in the embodiments of FIG. 5.

By randomly sampling values for the each lithography parameter, simulating random combinations of the values within the simulation tool 404, and repeating the sampling and variation until each lithography parameter is substantially varied within a range of its respective lithographic parameter model 412, a distribution of expected layout configurations 418 may be constructed. The distribution of expected layout configurations 418 can be used to examine a full range of possible patterning results which are achievable for a given lithographic process.

Figure 5:
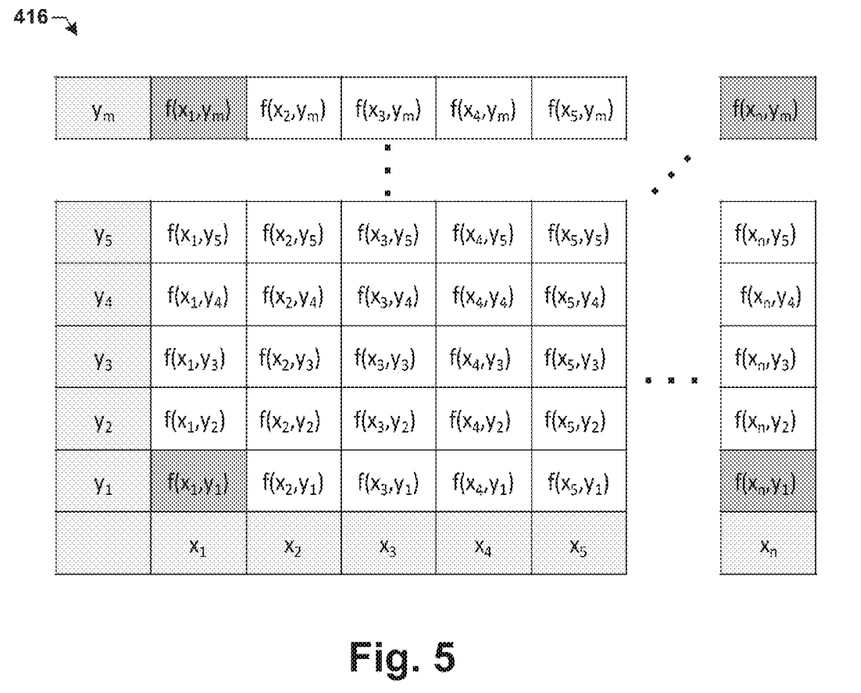
FIG. 5 illustrates some embodiments of a matrix, wherein each element of the matrix comprises a combination of the randomly-sampled lithography parameters for simulation.

FIG. 5 illustrates some embodiments of an n×m litho parameter matrix 416, wherein each element of the matrix, $f(x_1,y_1)$–$f(x_n,y_m)$ comprises a combination of the randomly-sampled lithography parameters. For the embodiments of FIG. 5, the litho parameter matrix 416 comprises a function of two parameters: $f(x,y)$. In general, the function (i.e., simulation) is a function of more than two parameters, as will be demonstrated in FIG. 6. For the embodiments of FIG. 5, the values of n and m are determined by a number of Monte-Carlo samplings utilized to sample a substantial portion of the range of variation of the process model for x and y. For instance, n Monte-Carlo samplings where required to substantially sample the process model for x. Likewise, m Monte-Carlo samplings where required to substantially sample the process model for y. Once both ranges are substantially sampled, each element of the litho parameter matrix 416 is simulated to obtain the distribution of expected layout configurations 418.

Figure 6:
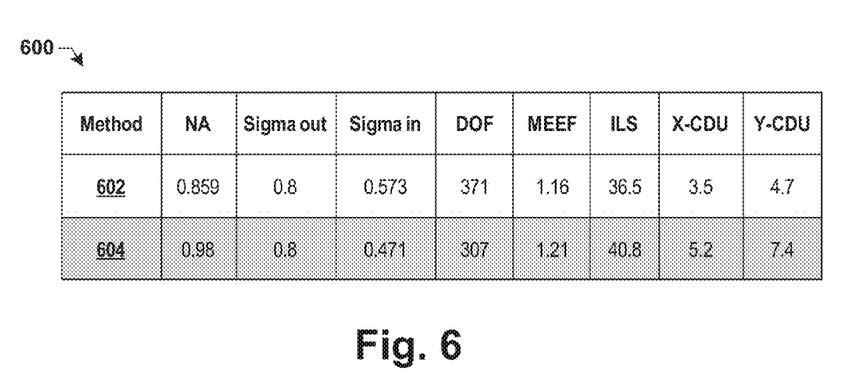
FIG. 6 illustrates an exemplary set of lithography conditions and resultant critical dimension (CD) uniformity.

FIG. 6 illustrates a table 600 representing an exemplary set of lithography conditions, and resultant critical dimension uniformity (CDU) of an expected layout pattern. The table 600 of lithography conditions of FIG. 6 is for illustration purposes, and is not intended to impose a limitation on the scope of the present disclosure. Specifically, NA, outer-sigma, inner-sigma, DOF, MEEF, and ILS comprise only one combination of lithographic parameters for simulation. It is demonstrated in table 600 that a first lithography condition 602 gives a horizontal CDU (x-CDU) of 3.5 nm/shape (i.e., the variation in width of an expected layout feature is 3.5 nm per shape, or 1.75 nm per edge). Similarly, the first lithography condition 602 gives a vertical CDU (y-CDU) of 4.7 nm/shape. The simulated result of the first lithography condition 602 gives a superior result to a simulated result of a second lithography condition 604 (x-CDU=5.2 nm/shape, y-CDU=7.4 nm/shape).

The second lithography condition 604 only considers maximum and minimum values for the lithographic parameters. In contrast, the first lithography condition 602 considers many combinations which substantially cover a range of variation for each parameter. The values for the lithographic parameters of the first lithography condition 602 were randomly sampled by a Monte-Carlo technique. The random sampling was repeated until a range of variation of each lithography parameter was substantially sampled. The various combinations of values were then entered into a matrix, wherein each element of the matrix comprises a lithography condition represented by a random combination of values of the parameters. Each element of the matrix was then simulated, and the best result, comprising first lithography condition 602, is reported in the table 600. Note that while the matrix 500 comprises a two-dimensional matrix, a matrix corresponding to the exemplary set of lithography conditions in table 600 would utilize an eight-dimensional matrix.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to a method to simulate patterning of a layout. The method comprises simulating formation of a layout pattern under a first lithography condition. The first lithography condition comprises a set of parameters, wherein a value of each parameter is defined by a corresponding process model. The method further comprises randomly varying the value of each parameter of the first lithography condition within a range of values defined by the corresponding process model of the parameter, to create a second lithography condition. Formation of a layout pattern is then re-simulated under the second lithography condition. Random variation of the value of each parameter is repeated to create additional lithography conditions. And, each lithography condition is re-simulated until the value of each parameter has been substantially varied across a range of its respective process model.

In some embodiments, the present disclosure relates to a method for IC manufacturing within a lithography process, comprising simulating formation of a layout pattern of the IC under a first lithography condition comprising a set of parameters, wherein a value of each parameter is defined by a process model. The method further comprises randomly varying the value of each parameter of the first lithography condition within a range of values defined by its process model to create a second lithography condition, and re-simulating the formation of the layout pattern under the second lithography condition. The random variation of the value of each parameter is repeated to create additional lithography conditions, and each lithography condition is re-simulated until the value of each parameter has been substantially varied across a range of its respective process model.

In some embodiments, the present disclosure relates to a method for IC manufacturing within a lithography process, comprising inputting a target layout pattern of the IC into a lithography simulation tool, randomly generating a combination of values for parameters of the lithography process, and applying the combination of values to a simulation of target layout patterning. The method further comprises simulating target layout patterning in the lithography simulation tool to produce an expected layout pattern, and determining whether dimensions of the expected layout pattern are within specification limits of the lithography process. The random generation of the combination of values for the parameters is repeated, and the target layout patterning is re-simulated until the dimensions of the expected layout pattern are within specification limits of the lithography process.

In some embodiments, the present disclosure relates to a tool arrangement, configured to perform a lithography simulation. The tool arrangement comprises a Monte-Carlo tool configured to randomly-sample a value of a value of a lithography parameter from its process model, wherein the process model represents a range of variation of a lithography parameter within the lithography process. The Monte-Carlo tool is further configured to model a lithography condition as a combination of randomly-sampled lithography parameters values, and transmit the lithography condition to a simulation tool configured to simulate formation of a layout pattern under the lithography condition.

What is claimed is:

1. A method for integrated chip (IC) manufacturing within a lithography process, comprising:
   simulating formation of a layout pattern of the IC, within a lithographic simulation tool, under a first lithography condition comprising a set of parameters, wherein a value of each parameter is defined by a process model;
   randomly varying the value of a parameter of the first lithography condition within a range of values defined by its process model to create a second lithography condition;
   re-simulating the formation of the layout pattern under the second lithography condition; and
   repeating the random variation of values of parameters of the set of parameters to create additional lithography conditions, re-simulating each lithography condition until the value of each parameter has been substantially varied across a range of its respective process model by obtaining simulation results for values of the parameter that are within a predefined resolution, such that any value of a parameter sampled from its process model is within a predefined percentage of the range from another value of the parameter sampled from the process model.

2. The method of claim 1, wherein the values of the parameters for each lithography condition are randomly-sampled from their respective process models by a Monte-Carlo technique.

3. The method of claim 2, wherein the parameter comprises coherence of radiation produced by a lithography tool performing the lithography process, a depth of focus of the radiation, a numerical aperture of the lithography tool, an intensity gradient of the radiation, sigma-outer and sigma-inner settings of the lithography tool, a mask error enhancement factor, target shape biasing, assist feature placement, mask film stack, or wafer film stack.

4. The method of claim 1, further comprising re-simulating the additional lithography conditions until dimensions of the simulated layout pattern are within predetermined limits.

5. The method of claim 4, wherein the dimensions comprise a minimum dimension of a feature within the layout pattern, a maximum dimension of the feature, a uniformity of an edge of the feature, or a uniformity in a space between two features.

6. The method of claim 4, further comprising re-simulating the additional lithography conditions until a distribution of expected layout configurations is established.

7. The method of claim 1, wherein a substantial variation of the parameter across the range of its process model comprises obtaining simulation results for values of the parameter that are within a predefined percentage from maximum or minimum values of the range of the parameter that are defined by the process model.

8. A tool arrangement, configured to perform a lithography simulation, comprising:
 a Monte-Carlo tool configured to:
  randomly-sample a value of a lithography parameter from its process model, wherein the process model represents a range of variation of the lithography parameter within a lithography process;
  model a lithography condition as a combination of randomly-sampled lithography parameters values; and
  transmit the lithography condition to a simulation tool configured to simulate formation of a layout pattern under the lithography condition;
 wherein the Monte-Carlo tool is further configured to achieve a substantial variation of the parameter that is sampled from its process model by obtaining simulation results for values of the parameter that are within a predefined percentage from maximum or minimum values of a range of the parameter that are defined by the process model.

9. The tool arrangement of claim 8, further comprising a lithographic measurement tool configured to measure the value of the parameter, wherein the parameter includes a depth of focus of radiation produced by the lithography tool, a numerical aperture of the lithography tool, variation in dimensions of a mask used to form the layout pattern, intensity gradient of the radiation.

10. The tool arrangement of claim 9, wherein the lithographic measurement tool is further configured to measure a variation of the value of the parameter across a reticle field, or to compare the value between two of more reticle fields.

11. The tool arrangement of claim 8, wherein the Monte-Carlo tool is further configured to achieve a substantial variation of the parameter that is sampled from its process model by obtaining simulation results for values of the parameter that are within a predefined resolution, such that any value of the parameter sampled from the process model is within a predefined percentage of the range from another value of the parameter that is sampled from the process model.

12. The tool arrangement of claim 8, wherein the simulation tool is further configured to measure dimensions of the simulated layout pattern to determine if they are within predetermined limits.

13. The tool arrangement of claim 12, wherein the dimensions of the simulated layout pattern comprise a minimum dimension of a feature within the layout pattern, a maximum dimension of the feature, a uniformity of an edge of the feature, or a uniformity in a space between two features.

14. A method, comprising:
 creating a plurality of lithography conditions, wherein each lithography condition includes a random combination of values of a set of parameters, wherein the value of each parameter is defined by a process model;
 simulating formation of a layout pattern under one or more of the plurality of lithography conditions within a lithographic simulation tool until the value of each parameter of the set has been substantially varied across a range of its respective process model; and
 creating a distribution of expected layout configurations within a matrix comprising n dimensions, wherein n is equal to a number of Monte-Carlo simulations utilized to substantially vary a parameter across the range of its respective process model.

15. The method of claim 14, wherein a total number of elements within the matrix is equal to a total number of Monte-Carlo simulations utilized to substantially vary each parameter of the set across the range of its respective process model.

16. The method of claim 14, wherein a substantial variation of the parameter across the range of its process model comprises obtaining simulation results for values of the parameter that are within a predefined percentage from maximum or minimum values of the parameter that are defined by the process model.

17. The method of claim 14, wherein a substantial variation of the parameter across the range of its process model comprises obtaining simulation results for values of the parameter that are within a predefined resolution, such that any value of the parameter sampled from the process model is within a predefined percentage from another value of the parameter sampled from the process model.

18. The method of claim 14, wherein the set of parameters comprise coherence of radiation produced by a lithography tool, a depth of focus of the radiation, a numerical aperture of the lithography tool, an intensity gradient of the radiation, sigma-outer and sigma-inner settings of the lithography tool, a mask error enhancement factor, target shape biasing, assist feature placement, mask film stack, or wafer film stack.

19. The method of claim 14, further comprising measuring dimensions of the simulated layout pattern to determine if they are within predetermined limits, wherein the dimensions of the simulated layout pattern comprise a minimum dimension of a layout feature, a maximum dimension of the layout feature, a uniformity of an edge of the layout feature, or a uniformity in a space between two layout features.

20. The method of claim 14, wherein the simulated layout pattern is formed from graphical layout data.

\* \* \* \* \*